United States Patent
Cohen

(10) Patent No.: US 9,438,172 B2
(45) Date of Patent: Sep. 6, 2016

(54) DIGITAL MULTI-LEVEL ENVELOPE TRACKING FOR WIDE-BANDWIDTH SIGNALS

(71) Applicant: Intel IP Corporation, Santa Clara, CA (US)

(72) Inventor: Emanuel Cohen, Zichron Yaacov (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/499,548

(22) Filed: Sep. 29, 2014

(65) Prior Publication Data

US 2016/0094186 A1    Mar. 31, 2016

(51) Int. Cl.
  *H03F 1/02* (2006.01)
  *H03F 3/21* (2006.01)
  *H03F 1/32* (2006.01)

(52) U.S. Cl.
  CPC ............ *H03F 1/0233* (2013.01); *H03F 1/025* (2013.01); *H03F 3/21* (2013.01); *H03F 2200/102* (2013.01)

(58) Field of Classification Search
  USPC .......................... 330/136, 127, 134, 297, 279
  See application file for complete search history.

(56) References Cited

U.S. PATENT DOCUMENTS

| | | | |
|---|---|---|---|
| 7,696,822 B2 | 4/2010 | Wang | |
| 8,766,716 B2 * | 7/2014 | Paek | H03F 3/2178 330/10 |
| 8,786,373 B2 * | 7/2014 | Presti | H03F 3/24 330/127 |
| 8,829,993 B2 * | 9/2014 | Briffa | H03F 1/025 330/136 |
| 8,947,161 B2 * | 2/2015 | Khlat | H03F 1/0211 330/136 |
| 2013/0141169 A1 | 6/2013 | Khlat et al. | |
| 2013/0169357 A1 | 7/2013 | Drogi et al. | |
| 2014/0132354 A1 | 5/2014 | Briffa et al. | |

OTHER PUBLICATIONS

Asbeck, et al. "Si IC Development for High Efficiency Envelope Tracking Power Amplifiers." Silicon Monolithic Integrated Circuits in RF Systems (SiRF), 2012 IEEE 12th Topical Meeting. Jan. 2012.
Sehajpal, et al. "Impact of Switching Glitches in Class-G Power Amplifiers." IEEE Microwave and Wireless Components Letters, vol. 22, No. 6. Jun. 2012.
Onizuka, et al. "1 1.8 GHz Liner CMOS Power Amplifier With Supply-Path Switching Scheme for WCDMA/LTE Applications." Solid-State Circuits Conference Digest of Technical Papers. Feb. 2013.

* cited by examiner

*Primary Examiner* — Hieu Nguyen
(74) *Attorney, Agent, or Firm* — Eschweiler & Associates, LLC

(57) ABSTRACT

Digital envelope tracking with multilevel supply voltages is performed for wide-bandwidth signals. A digital control component generates a digital control code that facilitates switching of resistor values of one or more resistors coupled between a power amplifier and a supply voltage of plurality of supply voltages. A driver component supplies an envelope voltage of the plurality of supply voltages for the power amplifier as a function of the digital control code.

25 Claims, 11 Drawing Sheets

DIGITAL MULTI-LEVEL ENVELOPE TRACKING FOR WIDE-BANDWIDTH SIGNALS

FIELD

The present disclosure relates to envelope tracking for wide-bandwidth signals, and more specifically, digital multi-level envelope tracking.

BACKGROUND

High-efficiency power amplifiers (PAs) offer valuable solutions in mobile wireless communication devices. With modern wireless systems, modulation formats have a high envelope peak-average ratio (PAR) and linear PAs have low average efficiency. Power supply control schemes such as envelope tracking offer a high potential for a high average efficiency operation for high PAR signals (e.g., up to a factor of two). However, due to bandwidth limitations of the DC-DC converter, traditional supply control schemes can be limited to narrow bandwidth applications of a few MHz, for example. ET solutions today can include "hybrid" architectures with a DC-DC and a fast linear regulator that results in a complex system with reduced efficiency. In addition, systems for these schemes include external components as inductors that increase the cost of the solution.

DETAILED DESCRIPTION

Figure 1:
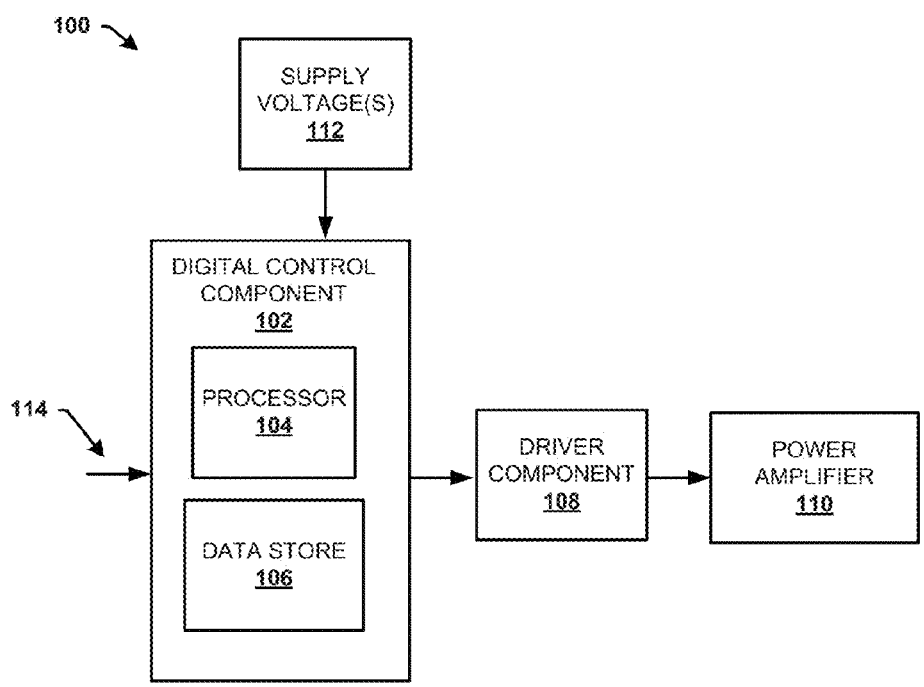
FIG. 1 is a block diagram illustrating an envelope tracking system according to various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies of power control schemes for PAs, various aspects are described for utilizing envelope tracking across multiple defined levels of voltages with one or more different supply voltages as a function of a digital control component that generates a digital control code. Multi-level envelope tracking, for example, refers to operations that rapidly switch between different voltage levels to modify a supply voltage of a PA according to the output power of the PA. The envelope tracking systems disclosed can enable very high bandwidths without an efficiency penalty and without external inductors. A digital control component generates a digital control code that facilitates switching of resistance values or resistances that can be defined by groups of switches (e.g., transistors). The digital control code facilitates different combinations of the switches that are coupled between one or more different supply voltages to generate an envelope voltage to the power amplifier and track an input signal. The digital control code defines resistance values in one embodiment by operating the switches to couple together different combinations of resistors, for example. Therefore, the digital code operates to define resistor combinations via a combination of switches to transition to different voltage levels that are provided between different constant voltage supplies.

The envelope tracking systems can operate as entirely digital system, which can provide further advantages over analog options by avoiding high dropout voltages resulting from high noise that is caused by transition issues and demands compensation mechanisms for stability. The digital control component can operate to reduce transition noise caused between voltage supplies by digitally controlling the transition phases. Dropout is further reduced from the switching techniques disclosed, which further enable a reduction in system components such as operational amplifiers (OP amps) and digital-to-analog converters (DACs). Additional aspects and details of the disclosure are further described below with reference to figures.

FIG. 1 illustrates an overview of an envelope tracking system 100 for wide bandwidth signals in accordance with various aspects being described. A digital control component 102 can comprise a processor 104 and a data store 106 for generating a digital control code to control modification of an envelope voltage that is supplied to a PA 110 (e.g., a radio frequency PA or the like). The digital control component 102 is coupled to a driver component 108 that operates to modify resistor values or resistances between a select one of a plurality of constant supply voltages 112 and the power amplifier 110.

In one embodiment, the digital control component 102 operates to digitally generate an envelope voltage to the PA 110 by switching resistors coupled between at least one of the supply voltages 112 and the PA 110. The digital control component 102 generates a digital code in response to the envelope input signal being received or detected at an envelope input 114 to the digital control component 102. In one aspect, the digital control code digitally operates or controls various combinations of switches that can be coupled to different supply voltages 112 respectively. The switches, for example, can comprise similar or different groups of transistors corresponding to the different levels of voltages or the constant voltage supplies.

A power efficiency of the PA 110 can be increased by the digital operations of the digital control component 102 to more accurately define a voltage level supplied the PA 110 as a function of an envelope input voltage 114 and the generated digital control code. The digital control component 102 is able to facilitate envelope tracking to reach a very high bandwidth of modulation and enable a significant reduction in output noise level. For example, the envelope tracking system can operate to boost the efficiency of the PA 110 for high peak-average ratios (PAR) values more than 30% and enable the system to be completely integrated with the PA 110 on a same package or microchip without any external capacitors or inductors being coupled to or utilized by the package or microchip, such as on a System on a Chip (SoC) or a Wi-Fi SoC where cost and power consumption can be important considerations.

The driver component 108 operates to supply the different supply voltages for generating an envelope voltage to the PA 110 by controlling the switches in response to or as a function of the digital control code. For example, Based on the digital control code, the driver component 108 can select from different groups of circuits or different pluralities of switches to regulate the supply voltages 112 to drive switches for defining different resistance values. The driver component 108 can operate between 1.8V-0.7V, for example, in which the 1.8V can be supplied from a constant supply voltage 112 and the 0.7V can be generated by an internal low dropout regulator (LDO), or a different voltage supply, for example. During tracking operations of the system 100, the driver component 108 can operate to discharge capacitors (e.g., internal capacitors) into the 0.7V LDO for example.

Figure 2:
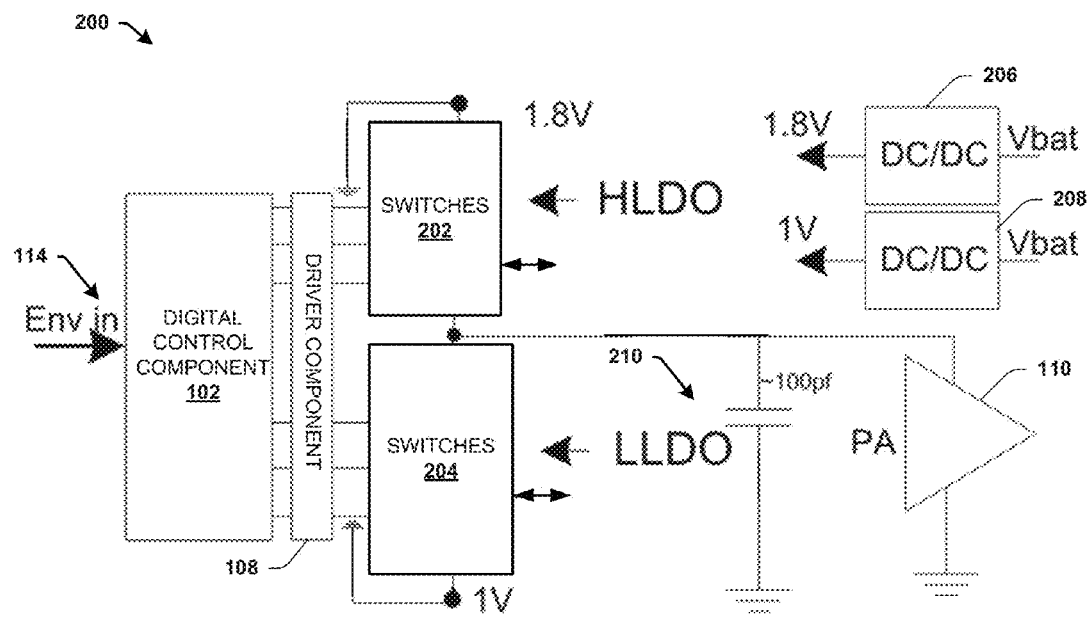
FIG. 2 is a block diagram illustrating another envelope tracking system according to various aspects described.

Referring to FIG. 2, illustrated is another example of an envelope tracking system 200 that includes similar components as discussed above and further comprises different groups of circuits (e.g., switches) that correspond to different constant supply voltages for digital multi-level envelope tracking. The switches include at least a first group of switches 202 and a second group of switches 204, for example. These groups of switches 202 and 204 can each correspond respectively to a different constant voltage supply 206 (e.g., 1.8V) and 208 (e.g., 1V). Additional or alternative levels of different constant voltages, for example, can also be envisioned in such a multi-level envelope tracking system.

In one embodiment, the constant (e.g., regulated) voltage supplies 206 and 208 can be provided from constant DC voltage sources (e.g., Vbat) and coupled respectively to terminals of the switches. For example, the first group of switches 202 can receive a high low drop out regulator voltage (HLDO) of a higher voltage value than the second group of switches receiving a low voltage supply (LLDO). Both groups can be grounded via ground terminals and operate without need of or independently of capacitors, which is an aspect that is enabled by the production of a digital control code for switching transitions between various voltage levels for generation of an envelope voltage to the PA 110, for example.

In another embodiment, the digital control component 102 can operate to control the switches as a function of the envelope input 114 and generate the digital control code controlling the switches and the different groups 202, 204 independently from differences between signal levels, which can be mapped, pre-defined or determined from an envelope voltage map, for example. The digital control code, for example, can indicate differentials among a previous signal envelope input 114 and a current level. Rather than switching being conducted on a full transistor core or complete set of transistors, the impact between switching frequency and power loss can be mitigated by the digital control code being generated. The digital control code can be generated as a function of differences in signals (e.g., power signals, voltage signals or the like) that can be switched as a function of a previous signal level or the previously generated digital code, for example. Consequently, dynamic switching losses resulting from the transitions are dependent upon a signal bandwidth and not switching frequency. The switching frequencies of the systems discloses, for example, can operate above 1 GHz without any efficiency degradation. In addition, the digital control code enables the system to predefine or map the transitions between voltage levels being supplied to the PA 110, which digitally improves a noise floor or level greater than 10 dB.

Furthermore, in another embodiment a capacitor 210 can operate to support RF currents. An open loop bandwidth can be defined by the capacitor 210 (e.g., 100 pF) on a constant supply voltage and a maximum resistance of the switches that is approximately 25 ohms resulting in close to about 400 MHz in signal bandwidth.

Figure 3:
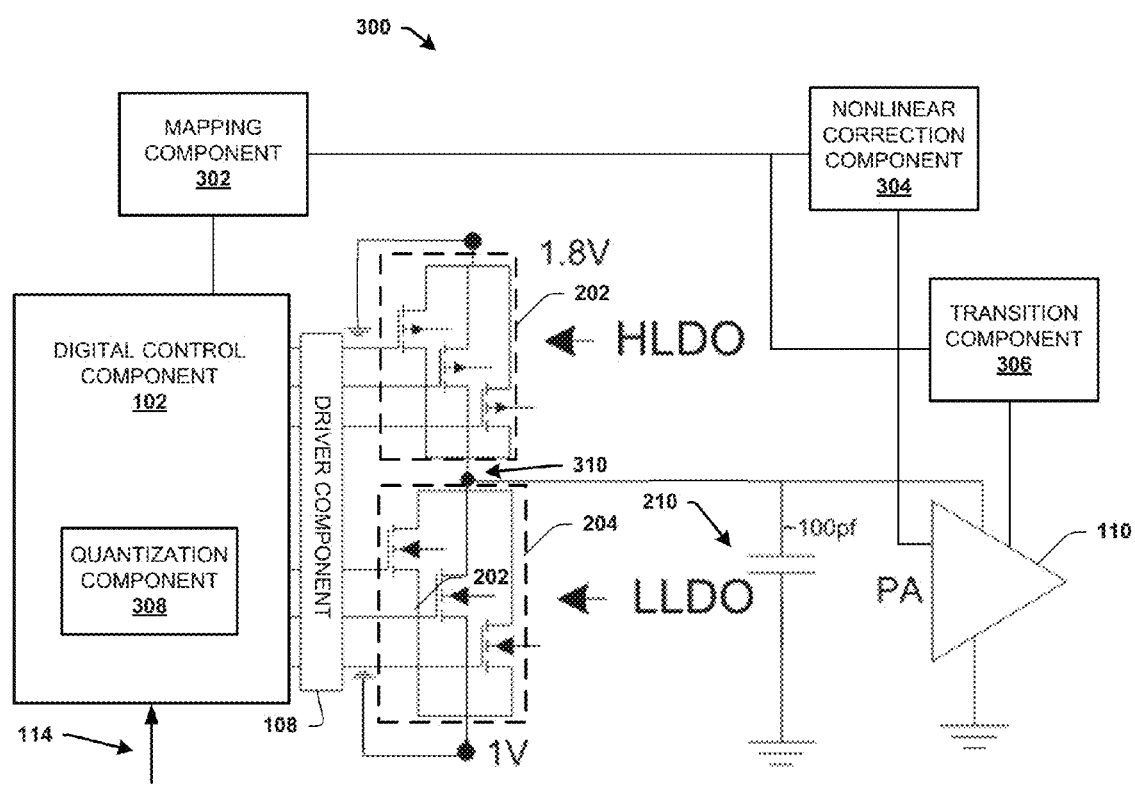
FIG. 3 is a block diagram illustrating another envelope tracking system according to various aspects described.

Referring now to FIG. 3, illustrated is another example of an envelope tracking system in accordance with various aspects disclosed. The envelope tracking system 300, similar to the systems above, operates to switch between multiple voltage levels rapidly, in which the switching losses are depending on the signal bandwidth instead of switching frequencies. The digital control component 102 generates a digital control code that controls groups of switches corresponding to different constant voltage supplies (e.g., HLDO, LLDO or the like). Driving a combination of transistors (e.g., parallel transistors or other configurations) operates to define resistor or resistance values. In this manner, resistor components or switches with resistances can be coupled in different combinations to different constant voltage supplies for envelope tracking as a function of a bandwidth at the envelope input 114.

Thus, in another embodiment, the digital control code generated by the digital control component 102 can dictate operation of one of a plurality of circuits (e.g., 202 or 204) that is supplied with one of a plurality of different supply voltage values or sources. The first plurality of switches 202 and the second plurality of switches 204 can comprise transistors, variable resistors, resistors or like components representative of circuits being selected as a function of the digital control code of the digital control code component 102 to define different resistance values. In addition, the driver component 108 further activates or deactivates various switches within the selected circuit 202 or 204 to form a resistance value that results in a unique voltage pass to the node 310 that serves as the envelope supply voltages provided to the PA 110. As such, the digital control code operates to quickly select between various circuits that are themselves supplied with different supply voltages and select switches to configure a unique resistance that results in a unique envelope voltages at the node 310.

The system 300 further comprises a mapping component 302, a nonlinear correction component 304, a transition component 306 and a quantization component 308 to facilitate operations for envelope tracking with the PA 110. The digital control component 102 generates a digital control code that tracks an envelope input signal in order to increase the PA efficiency (PAE) of PA 110 and reduce the noise level of the system 300. As illustrated, the digital control component 102 via the driver component 108 are connected to different groups of transistors switches 202 and 204, which correspond to and are coupled to different constant voltage supplies. The PA 110 is coupled to a tap or center node 310 that couples the different groups to receive an envelope tracking voltage that is modified by different combinations of the switches with resistor values.

The mapping component 302 is configured to generate a set of tracking data, such as for a calibration mode of operation. The mapping component 302 can generate an envelope tracking (ET) map, for example. The mapping component 302 can formulate the ET map as a function of a sweep of an input data to the PA 110 and output data of an output of the power amplifier. The behavior of the PA 110 can be analyzed in order to map or generate the tracking codes for an optimized linearity and efficiency without knowledge of, or without factoring, an actual PA supply voltage according to predetermined criteria. The mapping component 302 builds tracking codes in a manner that increases the robustness of open loop modulation.

The tracking data or code tracking to generate the ET map can also be used to determine at least one of an amplitude modulation behavior or a phase modulation behavior of the PA 110. The amplitude modulation behavior of the PA or the phase modulation behavior can then be provided to a pre-distortion component or the nonlinear correction component 304, which is configured to mitigate non-linearity of the PA 110.

The nonlinear correction component 304 can be configured to mitigate non-linearity of the PA 110 based on the at least one of the amplitude modulation behavior or the phase modulation behavior, such as by providing an inverse of distortion noted in the amplitude modulation behavior or the phase modulation behavior to the PA 110. In addition, the digital ET switching operations of the system 300 can add non-linear modulation to the output, thereby degrading the envelope voltage modulation and close by masking. The additional non-linearity can be due to the finite sampling (e.g., zero order hold—ZOH) of the supply over a continuous change of the input (e.g., cross modulation products). To correct for the non-linearity, the nonlinear correction component 304 can calculate the code changes or Δcode as a function of a current change between samples or a previous sample with a current sample, for example. At least a portion of the code change can then be added as Δcode/2 to a previous sample. In addition or alternatively, non-linearity can be mitigated in response to originating from a limited bandwidth of an ET track by having the system provide approximately 400 MHz bandwidth tracking that can cover the signals desired without correction or with some corrections via an equalizer of the non-linear correction component 304.

The transition component 306 operates to receive tracking data or code data gathered from the mapping component and mitigate transitional noise that can result from a transition between the different supply voltages as a function of the digital control code. The transition component 306 can generate a pre-charging of an additional set of switches or variable resistors to the PA 110. In one aspect, the additional switches can generate a first set of resistances with the first supply voltage (e.g., HDLO or supply voltage 206) concurrently to or at the same time as an operation of a second set of switches that generate a second set of resistances from a second supply voltage (e.g., LLDO or supply voltage 208). The switches can operate to ground each supply input to ground. Before the voltage supply transition occurs, the transition component 306 can turn on one or more switches to the supply to be transitioned to (e.g., the first 206 to the second 208, or vice versa). An inductor, for example, can be charged with a correct current in order to mitigate voltage supply transitions. A switch resistance can be determined so the inductor is charged to a required current for the voltage supply transition.

Alternatively or additionally, the transition component 306 can mitigate transitional noise that can result from a transition between the different supply voltages by generating at least one additional transition step to the supply voltage transitions. The transition component 306 can digitally operate at least one switch from the first set of additional switches that correspond to the first supply voltage and from the second set of switches that correspond to the second supply voltage concurrently or at the same time as one another. This simultaneous or concurrent operation of different switches can be done via software or digitally for small inductances as a small transition (e.g., less than 1 nH or 1 nHenry). For higher inductances (e.g., greater than 1 nH), the transition time would be quite long and could have more of an impact on the efficiency (e.g., reaching to about 10 mW for 10 nsec transitions for 40 MHz signals). Thus, the transition component 306 can operate to generate the pre-charging solution discussed above in such cases, for example.

The digital control component 102 receives envelope tracking data from the mapping component 302 and facilitates quantization of the digital control code as a function of an envelope signal via the quantization component 308. The quantization component 308 is configured to maintain or correspond to a set number of bits for quantization levels associated with switching of the resistances in the generation of the digital control code by the digital control component 102. The quantization component 308, for example, can assign binary weighted cells to sets of transistor switches of the switches 202 and the switches 204 associated with defined combinations for resistances. In addition, at least a portion of the set number of bits can be assigned to a thermometric decoding of a thermometric decoder (not shown), such as for a specific five bit output to control the driver component or other output to keep the noise of the binary transition from increasing beyond an output noise target level.

Figure 4:
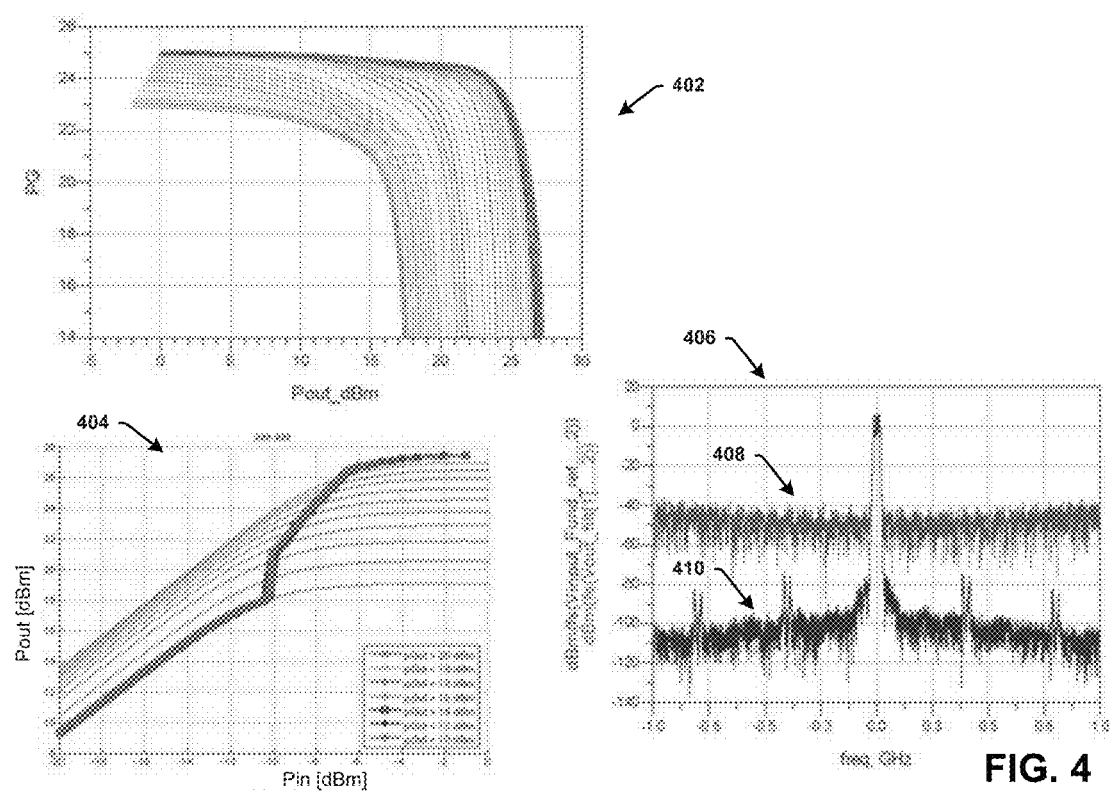
FIG. 4 is a set of graphs illustrating simulation results of envelope tracking systems according to various aspects described.

Referring to FIG. 4, illustrated are a set of graphs that demonstrate a simulation flow for the envelope tracking systems described. The graphs 402, 404 and 406 demonstrate simulation results for the envelope tracking systems to digitally control the proportionality of a supply voltage to the PA 110 with the envelope input signal 114 for reduced noise and increased efficiency while switching voltage supplies at high frequencies (e.g., at or greater than about 1 GHz, such as 1.5 GHz or greater).

A full ET system simulation can be operational with the digital codes and observation of the PA output. The digital codes enable the switching noise to result from switching bandwidths rather than switching frequencies. The graphs, for example, can illustrate a calibration mode of operation in the ET tracking system by trajectories tracking digital codes with received signal packets for generating an envelope voltage supply to the PA 110. The graph 402 illustrates measured gain characteristics for a signal by various digital codes generated by the digital control component 102.

The graph 404 illustrates an optimum track (ET map) and pre-distortion for optimum PAE versus linearity. The graph 404 illustrates various trajectories in the ET map via Pout versus the digital code being utilized with an input sweep Pin. The graph 406 illustrates that the noise floor increases at the output (curve 408) compared to the input (curve 410), and provides an example of the problem systems have when no transition control is applied. However, the systems disclosed can obtain a bandwidth of about 400 MHz, for example, for a wide bandwidth system, in which the switching frequency can be beyond 1 GHz, for example, without degrading efficiency. For example, the multi-level voltage supply digital envelope tracking systems can reach a 30% efficiency boost for a WiFi packet at about 8 dB backoff (18 dBm-19 dBm) and better than a 60 dBc noise floor.

The digital component 102 discussed above can operate to switching resistances and voltage supplies based on the differences in the code trajectories or code tracks mapped from an ET map of the mapping component 302, for example. The ET system removes at least a portion of calculation errors of resistance versus voltage in the calibration mode, and thus can generate a more robust system that can be implemented in an open loop system.

Figure 5:
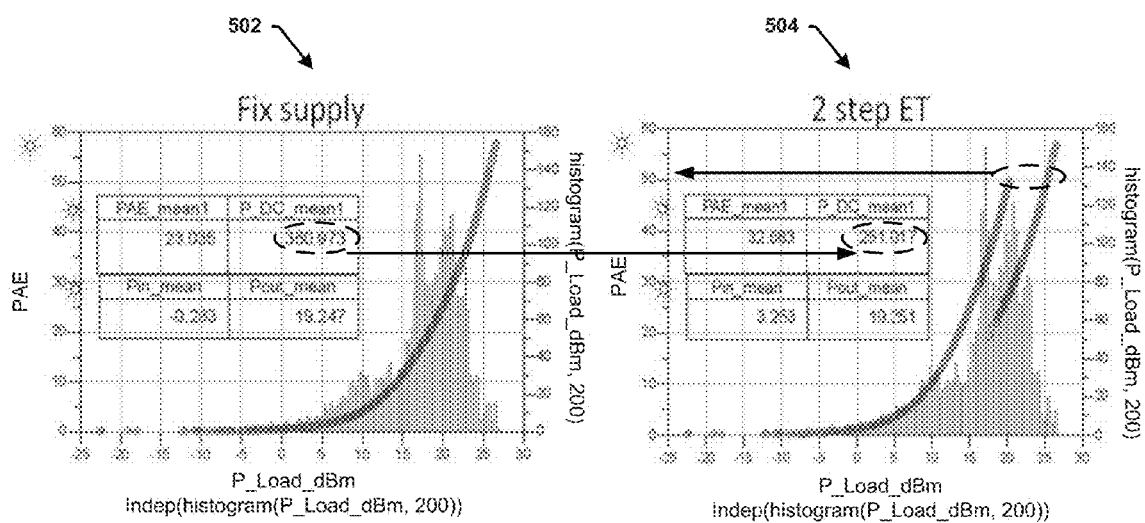
FIG. 5 is another set of graphs illustrating further simulation results of envelope tracking systems according to various aspects described.

Referring to FIG. 5, illustrated is a set of graphs demonstrating simulation results according to various aspects of envelope tracking systems described. The graphs 502 and 504 illustrate PAE curves with respect to DC power consumption levels for a PA with a fixed supply system and for the PA with envelope tracking systems as disclosed. The graph 502, for example, is with a fixed supply as compared to the graph 504 with envelope tracking system methods having multilevel constant supplies as described in this disclosure. The graph 504, for example, illustrates a switch from one efficiency curve to another at about 16 or 17 dBm along the x-axis or horizontal axis. The graph 504 further illustrates at least a 30% improved in DC consumption reduction, such as from approximately 360 mW as illustrated in graph 502 compared to approximately 251 mW as illustrated in graph 504.

Figure 6:
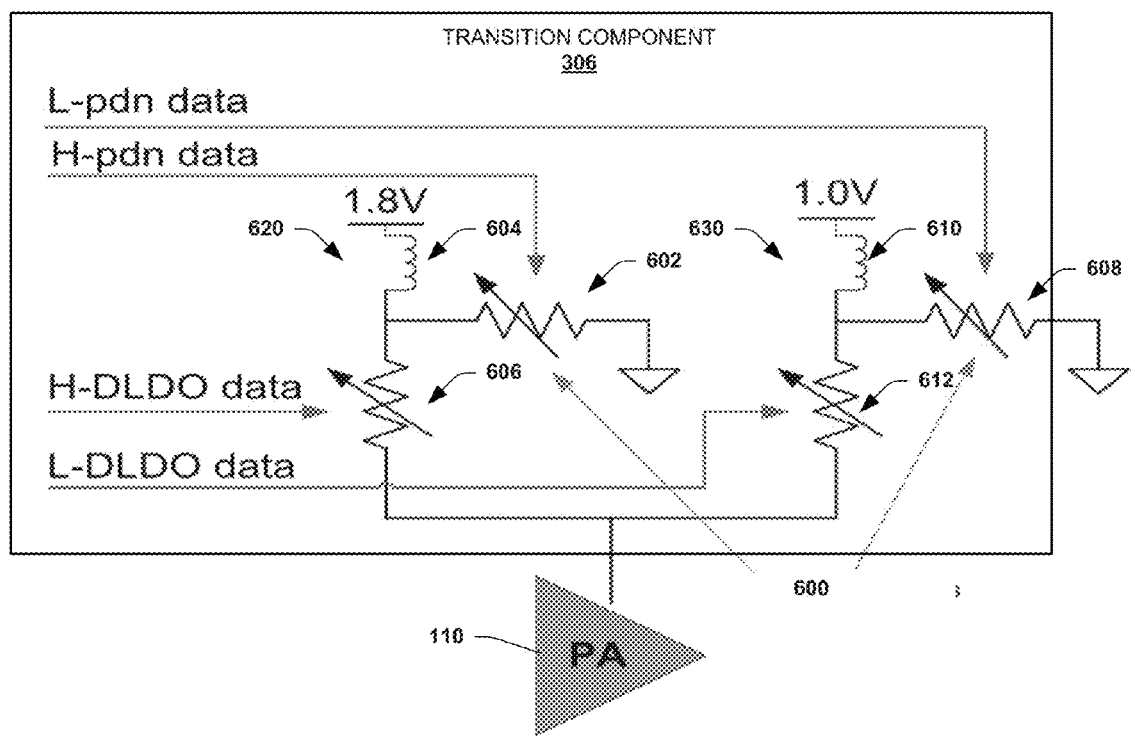
FIG. 6 is an example of a transition component of an envelope tracking system according to various aspects described.

Referring now to FIG. 6, illustrated is one example of the transition component 306 of FIG. 3 for the envelope tracking systems according to various aspects described herein. The transitions component 306 operates to mitigate transients or transition glitches from changes in the transition between different supply voltages for the PA 110 from at least one constant or regulated supply voltage to another (e.g., 1.8V to 1.0V, or 1.0V to 1.8V). The digital components of the systems can reduce or mitigate glitches for package inductance in the ET circuits to the supply of the PA 110.

For example, additional groups of switches 600 (illustrated as variable resistors) coupled to a ground terminal can be coupled to the PA 110. The additional switches can be grouped and correspondingly coupled to each constant voltage supply for pre-charging according to a switching transition or an order of voltage supply transition that will occur on the fly. A first group of switches can correspond to a higher constant voltage supply (e.g., supply 206) and a second group of switches can correspond to a lower constant voltage supply (e.g., supply 208), for example. The first group of switches can comprise a first switching circuit 620, for example, that includes a variable resistor 602 or other switch resistor control component(s) coupled to a ground terminal, another variable resistor switch 606 and an inductor component 604. The data related to the voltage supply 206 (e.g., H-pdn data, H-DLDO data) can be utilized to determine when a pre-charging of the first switching circuit should be initiated. In addition, a second group of switches can be included with a second switching circuit 630 that provides additional switches corresponding to data related to a different constant supply voltage (e.g., 208). The second switching circuit 630 comprises a switch resistance 608 coupled to ground, another switch resistor 612, and an inductor 610.

Before a voltage supply transition occurs from one supply to another, the switching circuit corresponding to the voltage to be switched to can be pre-charged with a corresponding voltage supply. For example, if switching is occurring from 1.8V to 1.0V the second switching circuit 630 is pre-charged beforehand by the 1.0V supply and the inductor 610 is supplied with a current corresponding to the data being received. The switch resistance is calculated so that the inductor is charged for the appropriate current for the transition. The same process happens for both transitions, such as from the 1.0V to the 1.8V supply. Because the inductor voltage drop is high for example at 1.8V to 1.0V, the pre-charge can be fast and happen in one clock cycle for typical package parasitic effects.

Figure 7:
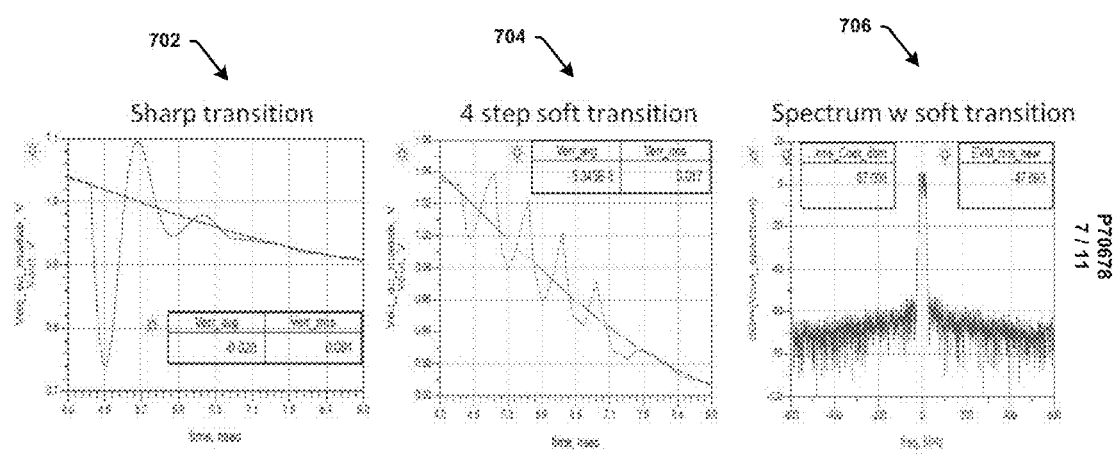
FIG. 7 is another set of graphs illustrating further characteristics of the transition component of an envelope tracking system according to various aspects described.

Referring to FIG. 7, illustrated is an example of graphs demonstrating an envelope tracking system with the transition component utilizing a soft transition without the pre-charging. The transition component 306 can operate a soft-transition for inductances that satisfy a threshold such as less than or at about 1 nH, for example and avoid utilizing hardware for pre-charging or operate in conjunction with hardware.

The graph 702 illustrates a sharp transition without any additional steps or intermediate transitions being defined. A large transient can be seen before settling the Vdc transition with the Vout over time. The graph 704 illustrates a case where four additional steps have been added via the transition component. For example, the transition component 306 can provide for both sets of switches from switches 202 and switches 204 being on for a period of time. This can directly affect the noise level by performing voltage supply transitions in more than one step. Switches from both groups 202 and 204 can be kept open during the transition for defining more than one transition step.

The graphs 702 and 704 demonstrate differences in the voltage behavior with a hard transition versus a soft transition with more than one defined transition step. The graph 702 demonstrates a 250 mV drop compared to 20 mV ripple in graph 704 with the soft transition occurring. The output spectrum 706 is illustrated, in which about 3 nanoseconds is utilized for the transition with the additional steps for a soft transition case, resulting in a power penalty of about 2 mW achieving noise level below 60 dBc.

Figure 8:
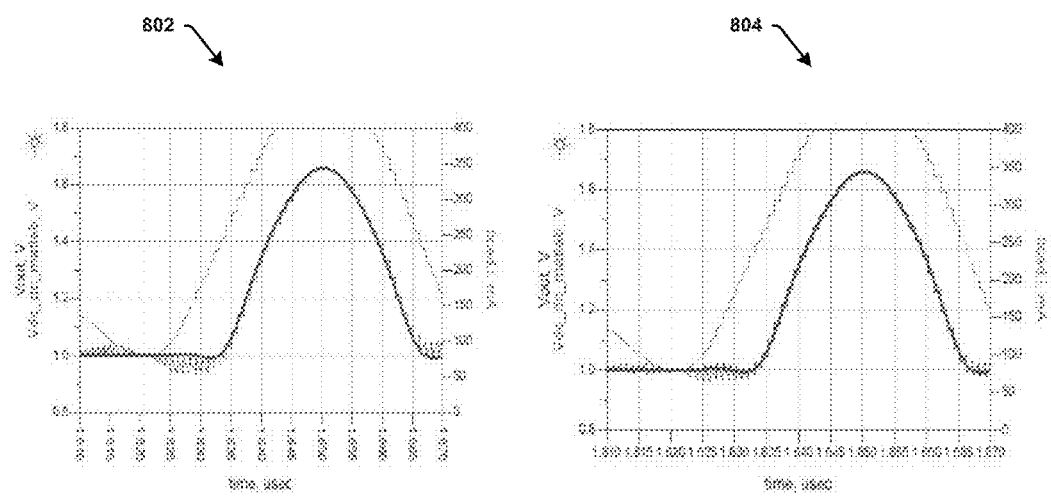
FIG. 8 a set of graphs illustrating characteristics of a nonlinear component of an envelope tracking system according to various aspects described.

Referring to FIG. 8, illustrated is an example of non-linear correction in accordance with the non-linear correction component described as part of the ET systems. The non-linear correction component 306 of FIG. 3 operates to correct for nonlinearities introduced in the sampling of the envelope voltage or supply voltage with the envelope input signal to increase an efficiency of the PA. The nonlinear correction component 306 can calculate a change in the digital code trajectories or tracks by ascertaining a current change between samples and add at least a portion of the difference (e.g., Δcode/2) to a previous sample of the supply voltage with the envelope input signal. Thus, the nonlinear correction component 306 can reduce the nonlinearity, which can result from the sampling of the supply to the PA causing cross modulation terms, based on a next digital track code.

The graph 802 illustrates the nonlinearity introduced from the sampling. The graph 804 illustrates differences in the correction via the nonlinear correction component 306. The original track is illustrated in graph 802 and the correction is illustrated in graph 804 resulting in an improved error vector magnitude (EVM) from 40 dB to about 50 dB, for example, with calculation of equation 1 shown below via the nonlinear correction component. A non-linearity in an analog system is higher due to smaller bandwidths and variation with time, which also cannot be corrected well with linear equalization. Equation 1 is as follows:

$$D_{code\_new} = \frac{D_{code}(P_{in}[n+1]) - D_{code}(P_{in}[n])}{2}. \quad \text{(equation 1)}$$

Figure 9:
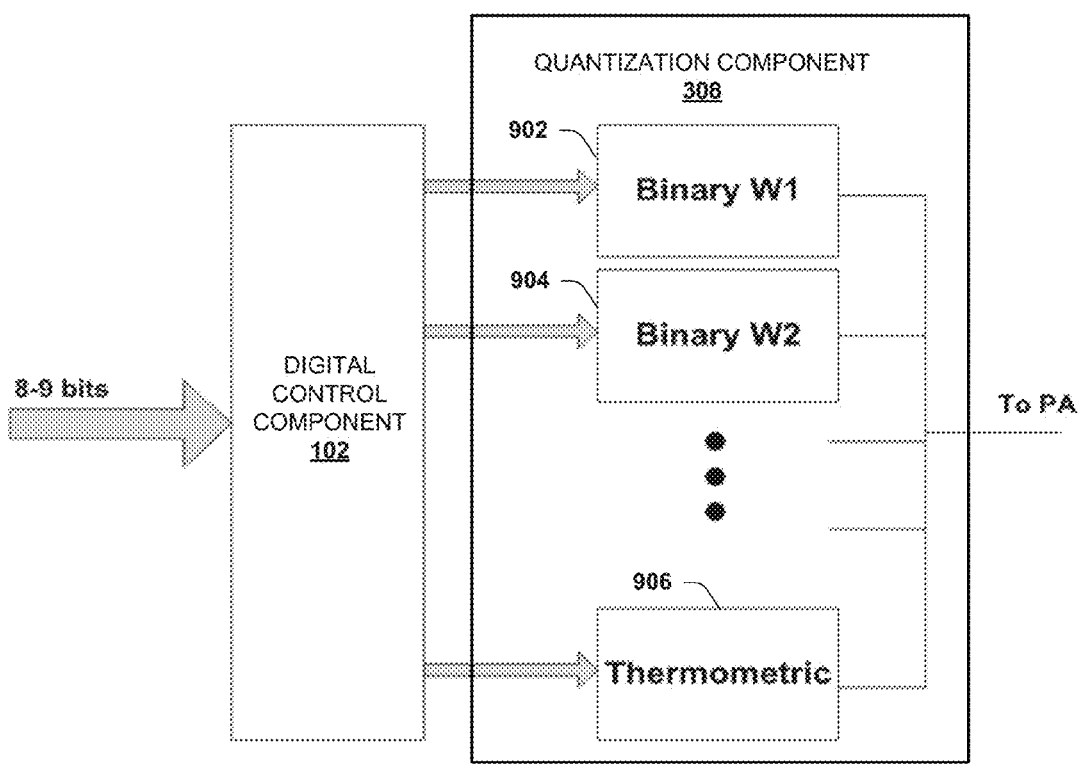
FIG. 9 is a block diagram illustrating a quantization component of an envelope tracking system according to various aspects described.
Figure 10:
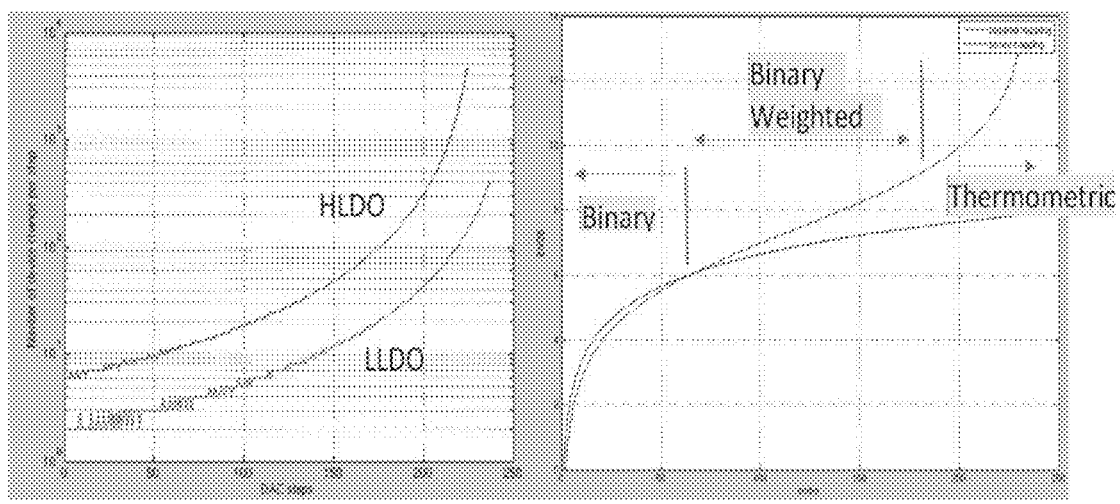
FIG. 10 is a set of graphs illustrating characteristics of a quantization component of an envelope tracking system according to various aspects described.

Referring to FIG. 9, illustrated is an example of the quantization component of ET systems in accordance with various aspects described. The quantization component 308 of FIG. 3 can include binary weighted cells 902, 904 (e.g., Binary W1, Binary W2 and so on) being assigned to or composing sets of switches or transistor switches that control resistor values and a thermometric decoder 906. The quantization component 308 enables an 8 bit resistance code to meet noise levels of about 70 dBc, for example. The scaling of devices to bits is illustrated in FIG. 10, for example, in which the scale size changes nonlinearly to meet the quantization of 8 to 9 bits. The lower a digital code, the fewer devices are needed to define the resistance value. The transistor size can be scaled to meet the quantization levels needed with an 8 to 9 bit digital control code. For upper codes, a resolution of about 4 k devices could be desired. By providing for binary weights to switches a lower amount of code can be utilized for a greater amount of devices. For example, rather than 14 bits of codes for a higher resolution change or transition, 8 bits could be utilized to cope with the strong non-linearity in resistive combining.

An 8 bit or 9 bit control of the decoder control component 102 can be utilized with a logic conversion or alternatively with weighted transistors and the thermometric code from a thermometric component 906. This utilizes binary cells that are weighted (about 10 units) and only the last five bits of the code to be thermometric, in order for the noise of the binary transition to not be beyond the target of about 70 dBc, for example.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 11:
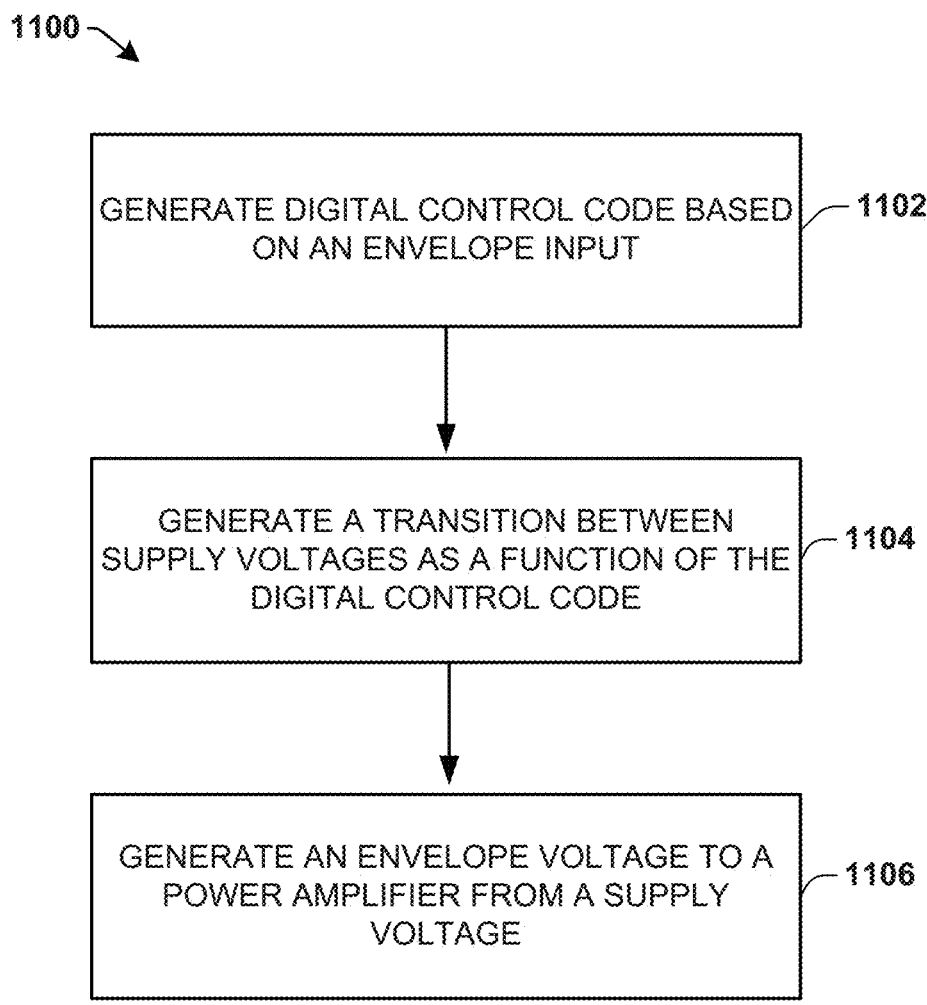
FIG. 11 is another flow diagram illustrating a method of an envelope tracking system according to various aspects described.

Referring to FIG. 11, illustrated is a method 1100 for generating an envelope voltage as a function of a digital control code to groups of transistors corresponding to different voltage supplies. The method initiates at 1102 with generating, via a digital control component, a digital control code based on an envelope input signal.

At 1104, the method comprises generating a transition between a select one of different supply voltages for a power amplifier from a first supply voltage to a second supply voltage as a function of the digital control code.

At 1106, an envelope voltage is generated to the power amplifier from the second supply voltage.

The method 1100 can further comprise defining a resistor value of a set of resistors coupled between the first supply voltage or the second supply voltage and the power amplifier by combining a first set of parallel transistors or a second set of parallel transistors respectively as a function of the digital control code.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a system for envelope tracking comprising a digital control component configured to generate a digital control code to switch resistances between a power amplifier and a select one of a plurality of supply voltages to generate an envelope voltage to the power amplifier. A driver component is configured to selectively supply one of the plurality of supply voltages to generate the envelope voltage to the power amplifier based on the digital control code.

Example 2 includes the subject matter of Example 1, wherein the digital control component is further configured to switch from a first supply voltage to a second supply voltage of the plurality of supply voltages as a function of the digital control code, wherein the first and second supply voltages are different from one another.

Example 3 includes the subject matter of any of Examples 1 and 2, including or omitting optional elements, further comprising a plurality of transistors configured to define the resistances based on one or more activated transistor combinations selected as a function of the digital control code.

Example 4 includes the subject matter of any of Examples 1-3, including or omitting optional elements, wherein the digital control component is further configured to generate the digital control code to indicate a difference in power signal levels from a previous level to a current level and facilitate a change in the envelope voltage to the power amplifier based on the difference by configuring a combination of parallel switches in a first plurality of switches or a second plurality of switches based on the digital control code.

Example 5 includes the subject matter of any of Examples 1-4, including or omitting optional elements, wherein the first plurality of switches are coupled to a first supply voltage of the plurality of supply voltages and the second plurality of switches are coupled to a second supply voltage of the plurality of supply voltages that is different from the first supply voltage.

Example 6 includes the subject matter of any of Examples 1-5, including or omitting optional elements, further comprising a mapping component configured to generate a set of tracking data to generate a code tracking map based on a sweep of an input power to the power amplifier for different digital control codes that control the resistances respectively and further based on a set of output data related to an output of the power amplifier.

Example 7 includes the subject matter of any of Examples 1-6, including or omitting optional elements, wherein the mapping component is further configured to determine at least one of an amplitude modulation behavior or a phase modulation behavior of the power amplifier and provide the at least one of the amplitude modulation behavior or the phase modulation behavior to a pre-distortion component that is configured to mitigate non-linearity of the power amplifier based on the at least one of the amplitude modulation behavior or the phase modulation behavior.

Example 8 includes the subject matter of any of Examples 1-7, including or omitting optional elements, wherein the digital control component is further configured to generate the digital control code based on an envelope tracking map to increase a linearity and an efficiency of the power amplifier, and is integrated on a same chip as other components of the system, including the driver component, without any external capacitors or inductors coupled thereto.

Example 9 includes the subject matter of any of Examples 1-8, including or omitting optional elements, further comprising a non-linear correction component configured to determine a digital code differential based on a change between voltage samples of the power amplifier and reduce nonlinearity introduced in a sampling of a supply voltage with respect to a change of an power amplifier input signal by providing at least a portion of the digital code differential to a previous sample.

Example 10 includes the subject matter of any of Examples 1-9, including or omitting optional elements, further comprising a transition component configured to mitigate transitional noise that results from a transition between the plurality of supply voltages as a function of the digital control code by generating a pre-charging of a first set of switches that generate a first set of resistances of the resistances with a first supply voltage concurrently to an operation of a second set of switches that generate a second set of resistances from a second supply voltage, or by generating at least one additional transition step to the transition by digitally operating at least one switch from the first set of switches and from the second set of switches concurrently.

Example 11 includes the subject matter of any of Examples 1-10, including or omitting optional elements, further comprising a quantization component configured to maintain a set number of bits for quantization levels associated with switching of the resistances in the generation of the digital control code by the digital control component by assigning binary weighted cells to sets of transistor switches associated with the resistances and assigning at least a portion of the set number of bits to a thermometric decoding of a thermometric decoder.

Example 12 is a method for envelope tracking that comprises generating, via a digital control component, a digital control code based on an envelope input signal. A transition is generated between plurality of supply voltages for a power amplifier from a first supply voltage to a second supply voltage as a function of the digital control code. An envelope voltage to the power amplifier is generated from the second supply voltage.

Example 13 includes the subject matter of Examples 12, further comprising defining a resistor value of a set of resistors coupled between the first supply voltage or the second supply voltage and the power amplifier by combining a first set of parallel transistors or a second set of parallel transistors respectively as a function of the digital control code.

Example 14 include the subject matter of any of Examples 12-13, including or omitting option elements, wherein the generating the digital control code comprises generating a difference between a first code and a second code to facilitate a change in the envelope voltage.

Example 15 include the subject matter of any of Examples 12-14, including or omitting option elements, further comprising reducing a transitional noise that results from the transition among the plurality of supply voltages as the function of the digital control code by generating a pre-charging of a first set of switches coupled to the first supply voltage and a second set of switches coupled to the second supply voltage before the transition, or by generating an additional transition step to the transition by digitally operating at least one switch concurrently from the first set of switches and from the second set of switches.

Example 16 includes the subject matter of any of Examples 12-15, including or omitting optional elements, further comprising determining whether to reduce the transitional noise that results from the transition among the plurality of supply voltages as the function of the digital control code by the generating of the pre-charging or the generating of the additional transition step based on a satisfaction of an inductance threshold.

Example 17 includes the subject matter of any of Examples 12-16, including or omitting optional elements, wherein generating the envelope voltages to the power amplifier further comprises generating a switching loss that is more dependent upon a change in a bandwidth of the envelope input signal than a switching frequency of the transition.

Example 18 includes the subject matter of any of Examples 12-17, including or omitting optional elements further comprising predefining one or more transitions between the plurality of supply voltages based on an envelope tracking map, wherein the generating of the digital control code comprises generating a difference between digital control codes corresponding to the plurality of supply voltages.

Example 19 includes the subject matter of any of Examples 12-18, including or omitting optional elements, further comprising generating an envelope tracking map with a set of tracking data to generate digital control codes that control resistance values between the first supply voltage or the second supply voltage and the power amplifier.

Example 20 includes the subject matter of any of Examples 12-19, including or omitting optional elements, further comprising determining a digital code differential based on a current change between voltage samples of the power amplifier, and providing at least a portion of the digital code differential to a previous sample to reduce a nonlinearity that is introduced in a sampling of the first supply voltage of the plurality of supply voltages with a change to the second supply voltage as an input to the power amplifier.

Example 21 includes the subject matter of any of Examples 12-20, including or omitting optional elements, further comprising determining quantization levels of a resistor value between the first supply voltage or the second supply voltage and the power amplifier with a set number of bits of the digital control code by assigning binary weighted cells to sets of transistor switches that define the resistor value and at least a portion of the set number of bits to a thermometric decoding of a thermometric decoder.

Example 22 includes a mobile device that facilitates digital multilevel voltage envelope tracking that comprises a memory storing executable instructions, and a processor, coupled to the memory, configured to execute the executable instructions to at least generate a digital control code to track an envelope voltage to a power amplifier, generate a switching of a resistor value with at least one of a first plurality of switches or a second plurality of switches coupled between the power amplifier and a plurality of supply voltages respectively to generate the envelope voltage based on the digital control code, and supply the envelope voltage generated from the plurality of supply voltages to the power amplifier.

Example 23 includes the subject matter of Examples 22, wherein the processor is further configured to execute the executable instructions to switch from a first supply voltage of a first voltage supply to a second supply voltage of a second voltage supply as a function of the digital control code to dynamically control the envelope voltage to the power amplifier according to a variation of a bandwidth of an envelope input signal.

Example 24 includes the subject matter of any of Examples 22-23, including or omitting optional elements, wherein the processor is further configured to execute the executable instructions to facilitate a change in the envelope voltage supplied to the power amplifier based on a difference in power signal levels from a previous level to a current level by configuring a combination of the first plurality of switches or the second plurality of switches to define a resistor value of the resistor value, wherein the first plurality of switches is configured to receive a first supply voltage and the second plurality of switches is configured to receive a second supply voltage with the digital control code.

Example 25 includes the subject matter of any of Examples 22-24, including or omitting optional elements, generate an envelope tracking map from data related to the power amplifier to generate the digital control code without factoring an actual supply voltage to the power amplifier for different digital control codes that control the resistor value respectively.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A system for envelope tracking comprising:
   a digital control component configured to generate a digital control code to switch resistances between a power amplifier and one of a plurality of supply voltages to generate an envelope voltage to the power amplifier;
   a driver component configured to selectively supply the one of the plurality of supply voltages to generate the envelope voltage to the power amplifier based on the digital control code; and
   a transition component configured to mitigate transitional noise that results from a transition between the plurality of supply voltages as a function of the digital control code by generating at least one additional transition step to the transition by digitally operating a switch from a first set of switches and another switch from a second set of switches concurrently.

2. The system of claim 1, wherein the digital control component is further configured to switch from a first supply voltage to a second supply voltage of the plurality of supply voltages as a function of the digital control code, wherein the first and second supply voltages are different from one another.

3. The system of claim 1, further comprising:
a plurality of transistors configured to define the resistances based on one or more activated transistor combinations selected as a function of the digital control code.

4. The system of claim 1, wherein the digital control component is further configured to generate the digital control code to indicate a difference in power signal levels from a previous level to a current level and facilitate a change in the envelope voltage to the power amplifier based on the difference by configuring a combination of parallel switches in a first plurality of switches or a second plurality of switches based on the digital control code.

5. The system of claim 4, wherein the first plurality of switches are coupled to a first supply voltage of the plurality of supply voltages and the second plurality of switches are coupled to a second supply voltage of the plurality of supply voltages that is different from the first supply voltage.

6. The system of claim 1, further comprising:
a mapping component configured to generate a set of tracking data to generate a code tracking map based on a sweep of an input power to the power amplifier for different digital control codes that control the resistances respectively and further based on a set of output data related to an output of the power amplifier.

7. The system of claim 6, wherein the mapping component is further configured to determine at least one of an amplitude modulation behavior or a phase modulation behavior of the power amplifier and provide the at least one of the amplitude modulation behavior or the phase modulation behavior to a pre-distortion component that is configured to mitigate non-linearity of the power amplifier based on the at least one of the amplitude modulation behavior or the phase modulation behavior.

8. The system of claim 1, wherein the digital control component is further configured to generate the digital control code based on an envelope tracking map to increase a linearity and an efficiency of the power amplifier, and is integrated on a same chip as other components of the system, including the driver component, without any external capacitors or inductors coupled thereto.

9. The system of claim 1, further comprising:
a non-linear correction component configured to determine a digital code differential based on a change between voltage samples of the power amplifier and reduce nonlinearity introduced in a sampling of a supply voltage with respect to a change of an power amplifier input signal by providing at least a portion of the digital code differential to a previous sample.

10. The system of claim 1,
wherein the transition component is further configured to mitigate transitional noise that results from the transition between the plurality of supply voltages as the function of the digital control code by generating a pre-charging of the first set of switches that generate a first set of resistances of the resistances with a first supply voltage concurrently to an operation of a second set of switches that generate a second set of resistances from a second supply voltage.

11. The system of claim 1, further comprising:
a quantization component configured to maintain a set number of bits for quantization levels associated with switching of the resistances in the generation of the digital control code by the digital control component by assigning binary weighted cells to sets of transistor switches associated with the resistances and assigning at least a portion of the set number of bits to a thermometric decoding of a thermometric decoder.

12. A method for envelope tracking comprising:
generating, via a digital control component, a digital control code based on an envelope input signal;
generating a transition between a plurality of supply voltages for a power amplifier from a first supply voltage to a second supply voltage as a function of the digital control code;
generating an envelope voltage to the power amplifier from the second supply voltage; and
reducing a transitional noise that results from a transition among the plurality of supply voltages as a function of the digital control code by generating an additional transition step to the transition by digitally operating a switch concurrently from a first set of switches and another switch from a second set of switches.

13. The method of claim 12, further comprising:
defining a resistor value of a set of resistors coupled between the first supply voltage or the second supply voltage and the power amplifier by combining a first set of parallel transistors or a second set of parallel transistors respectively as a function of the digital control code.

14. The method of claim 12, wherein the generating the digital control code comprises generating a difference between a first code and a second code to facilitate a change in the envelope voltage.

15. The method of claim 12, further comprising:
reducing the transitional noise that results from the transition among the plurality of supply voltages as the function of the digital control code by generating a pre-charging of the first set of switches coupled to the first supply voltage and the second set of switches coupled to the second supply voltage before the transition.

16. The method of claim 15, further comprising:
determining whether to reduce the transitional noise that results from the transition among the plurality of supply voltages as the function of the digital control code by the generating of the pre-charging or the generating of the additional transition step based on a satisfaction of an inductance threshold.

17. The method of claim 12, wherein generating the envelope voltages to the power amplifier further comprises generating a switching loss that is more dependent upon a change in a bandwidth of the envelope input signal than a switching frequency of the transition.

18. The method of claim 12, further comprising:
predefining one or more transitions between the plurality of supply voltages based on an envelope tracking map, wherein the generating of the digital control code comprises generating a difference between digital control codes corresponding to the plurality of supply voltages.

19. The method of claim 12, further comprising:
generating an envelope tracking map with a set of tracking data to generate digital control codes that control resistance values between the first supply voltage or the second supply voltage and the power amplifier.

20. The method of claim 12, further comprising:
determining a digital code differential based on a current change between voltage samples of the power amplifier; and
providing at least a portion of the digital code differential to a previous sample to reduce a nonlinearity that is introduced in a sampling of the first supply voltage of the plurality of supply voltages with a change to the second supply voltage as an input to the power amplifier.

21. The method of claim 12, further comprising:
determining quantization levels of resistor values between the first supply voltage or the second supply voltage and the power amplifier with a set number of bits of the digital control code by assigning binary weighted cells to sets of transistor switches that define the resistor values and at least a portion of the set number of bits to a thermometric decoding of a thermometric decoder.

22. A mobile device that facilitates digital multilevel voltage envelope tracking, comprising:
a memory storing executable instructions; and
a processor, coupled to the memory, configured to execute the executable instructions to at least:
  generate a digital control code to track an envelope voltage to a power amplifier;
  generate a switching of a resistor value with at least one of a first plurality of switches or a second plurality of switches coupled between the power amplifier and a plurality of supply voltages respectively to generate the envelope voltage based on the digital control code;
  supply the envelope voltage generated from the plurality of supply voltages to the power amplifier; and
  reduce a transitional noise that results from the transition among the plurality of supply voltages based on the digital control code by generating an additional transition step to the transition by digitally operating a switch concurrently from a first set of switches and another switch from a second set of switches.

23. The mobile device of claim 22, wherein the processor is further configured to execute the executable instructions to:
switch from a first supply voltage of a first voltage supply to a second supply voltage of a second voltage supply as a function of the digital control code to dynamically control the envelope voltage to the power amplifier according to a variation of a bandwidth of an envelope input signal.

24. The mobile device of claim 22, wherein the processor is further configured to execute the executable instructions to:
facilitate a change in the envelope voltage supplied to the power amplifier based on a difference in power signal levels from a previous level to a current level by configuring a combination of the first plurality of switches or the second plurality of switches to define the resistor value, wherein the first plurality of switches is configured to receive a first supply voltage and the second plurality of switches is configured to receive a second supply voltage with the digital control code.

25. The mobile device of claim 22, wherein the processor is further configured to execute the executable instructions to:
generate an envelope tracking map from data related to the power amplifier to generate the digital control code without factoring an actual supply voltage to the power amplifier for different digital control codes that control the resistor value respectively.

* * * * *